(12) United States Patent
Mori et al.

(10) Patent No.: US 7,501,897 B2
(45) Date of Patent: Mar. 10, 2009

(54) HIGH-POWER AMPLIFIER

(75) Inventors: Kazutomi Mori, Tokyo (JP); Shintaro Shinjo, Tokyo (JP); Masaharu Hattori, Tokyo (JP); Kazunori Takahashi, Tokyo (JP); Hiroaki Seki, Tokyo (JP); Akira Ohta, Tokyo (JP); Noriharu Suematsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 230 days.

(21) Appl. No.: 10/591,173

(22) PCT Filed: Jul. 14, 2004

(86) PCT No.: PCT/JP2004/010047

§ 371 (c)(1),
(2), (4) Date: Aug. 30, 2006

(87) PCT Pub. No.: WO2006/006244

PCT Pub. Date: Jan. 19, 2006

(65) Prior Publication Data
US 2007/0194853 A1     Aug. 23, 2007

(51) Int. Cl.
*H03F 3/04* (2006.01)
(52) U.S. Cl. ................. 330/302; 330/305; 330/310
(58) Field of Classification Search ............. 330/302, 330/305, 310
See application file for complete search history.

(56) References Cited

U.S. PATENT DOCUMENTS

| 6,130,589 | A  | * | 10/2000 | Yamaguchi et al. ......... 333/32 |
| 6,169,455 | B1 | * | 1/2001  | Yamaguchi .................. 330/279 |
| 6,522,201 | B1 | * | 2/2003  | Hsiao et al. .................. 330/278 |
| 6,538,506 | B2 | * | 3/2003  | Hareyama ..................... 330/51 |
| 6,566,944 | B1 | * | 5/2003  | Pehlke et al. .................. 330/10 |
| 6,700,440 | B2 | * | 3/2004  | Hareyama ..................... 330/51 |
| 6,927,625 | B2 | * | 8/2005  | Yamaguchi ............. 330/124 R |
| 2003/0063427 | A1 |   | 4/2003 | Kunihiro |
| 2004/0008082 | A1 |   | 1/2004 | Dow |
| 2004/0100341 | A1 |   | 5/2004 | Luetzelschwab et al. |

FOREIGN PATENT DOCUMENTS

| EP | 1 182 787 A1 | 2/2002 |
| JP | 5-175758 A | 7/1993 |
| JP | 6-276035 A | 9/1994 |
| JP | 8-51317 A | 2/1996 |
| JP | 9-284061 A | 10/1997 |
| JP | 11-220338 A | 8/1998 |
| JP | 11-97945 A | 4/1999 |
| JP | 11-330991 A | 11/1999 |
| JP | 2002-353751 A | 12/2002 |
| JP | 2003-124754 A | 4/2003 |

* cited by examiner

*Primary Examiner*—Patricia Nguyen
(74) *Attorney, Agent, or Firm*—Birch, Stewart, Kolasch & Birch, LLP

(57) ABSTRACT

A high-power amplifier changes matching conditions of an output matching circuit 5 connected between a final stage amplifying element 3 and an output terminal 8 in response to the output power of the amplifying element 3. Thus, the efficiency at low output power can be greatly improved without reducing the efficiency at the maximum output. Besides, since it is not necessary to load a DC-DC converter, an increase in size or cost can be prevented.

24 Claims, 16 Drawing Sheets

$Z_0=50[Ohm]$

FIG.4

| Pout [dBm] | Icq Const. | | | Icq Control | | |
| --- | --- | --- | --- | --- | --- | --- |
| | Icq [mA] | PAE [%] | ACPR [dBc] | Icq [mA] | PAE [%] | ACPR [dBc] |
| 10 | 18 | 12.47 | -62.67 | 2 | 28.81 | -40.87 |
| 11 | 18 | 18.06 | -65.03 | 3 | 32.00 | -41.77 |
| 12 | 18 | 21.07 | -62.69 | 3 | 35.97 | -40.24 |
| 16 | 18 | 36.81 | -39.37 | 7 | 47.87 | -38.19 |
| 19 | 18 | 42.21 | -40.89 | 7 | 45.26 | -38.98 |
| 20 | 18 | 46.47 | -38.90 | 14 | 48.11 | -38.56 |
| 21 | 18 | 49.77 | -40.92 | 14 | 51.02 | -39.56 |
| 24 | 18 | 50.44 | -38.66 | 14 | 50.78 | -38.37 |
| 25 | 18 | 48.99 | -38.87 | 18 | 48.99 | -38.87 |
| 26 | 18 | 45.42 | -40.08 | 18 | 45.42 | -40.08 |

In switch ON state

Con + Coff = Constant

Almost Unchanged

In switch OFF state

Con/Coff = Changed by −16 deg. at Con/Coff = 0.4pF/1.9pF
Con/Coff = Changed by −44 deg. at Con/Coff = 0.8pF/1.5pF
Con/Coff = Changed by −64 deg. at Con/Coff = 1.2pF/1.1pF

HIGH-POWER AMPLIFIER

TECHNICAL FIELD

The present invention relates to a high-power amplifier for amplifying an input signal to be output.

BACKGROUND ART

Generally, a high-power amplifier has a characteristic of increasing its output power with an increase in its input power, and of saturating at a certain level of the output power.

The efficiency of the high-power amplifier has a characteristic of increasing near the saturation and reducing at low output power.

Therefore the high-power amplifier has a problem of reducing its efficiency at the low output power.

A mobile phone that adopts a communication scheme such as W-CDMA and N-CDMA controls its output power in accordance with the distance between the mobile phone and a base station and with radio wave conditions. The mobile phone, however, is more likely to carry out its transmission at the output power 10-15 dB less than the maximum output power.

Thus, it is necessary for the high-power amplifier used by the mobile phone to increase its efficiency (to reduce power consumption) not only at the maximum output, but also at the output power 10-15 dB less than the maximum output to increase talk time.

A conventional high-power amplifier makes a contrivance to increase the efficiency at the low output power by a design for decreasing an idle current.

However, since it is insufficient, a high-power amplifier is proposed which tries to increase the efficiency at the low output power by controlling the drain voltage or collector voltage of an amplifying element in response to the output power (see Non-patent Document 1, for example).

The following is the details.

A signal input from an input terminal is supplied to an amplifying element via an input matching circuit composed of a DC-cut capacitor, capacitor and inductor, and is amplified. The signal output from the amplifying element is output from an output terminal via an output matching circuit composed of a DC-cut capacitor, capacitor and inductor.

At the low output power, the efficiency of the high-power amplifier is increased by reducing the voltage output from a DC-DC converter by varying the value of a variable resistor.

Non-patent Document 1: T. B. Nishimura, N. Iwata, and G. Hau, "IEEE MTT-S Symp. Digest", 1999, pp. 1091-1094.

With the foregoing configuration, the conventional high-power amplifier can improve the efficiency at the low output power to some extent by reducing the voltage output from the DC-DC converter by varying the value of the variable resistor. However, since the DC-DC converter is bulky, it offers a problem of being difficult to miniaturize the high-power amplifier, and of increasing its cost. In addition, the efficiency of the DC-DC converter itself reduces the overall efficiency, offering a problem of impairing the efficiency at the low output power.

The present invention is implemented to solve the foregoing problems. Therefore it is an object of the present invention to provide a high-power amplifier capable of increasing the efficiency at the low output power without increasing the cost or size.

DISCLOSURE OF THE INVENTION

A high-power amplifier in accordance with the present invention changes the matching condition of a matching circuit connected between a final stage amplifying element and an output terminal in response to the output power of the amplifying element.

Thus, it offers an advantage of being able to increase the efficiency at low output power without increasing its cost or size.

BRIEF DESCRIPTION OF THE DRAWINGS

FIG. 4 is a table illustrating efficiency and ACPR (Adjacent Channel leakage Power Ratio) in the case of the optimum impedance;

BEST MODE FOR CARRYING OUT THE INVENTION

The best mode for carrying out the invention will now be described with reference to the accompanying drawings to explain the present invention in more detail.

EMBODIMENT 1

Figure 1:
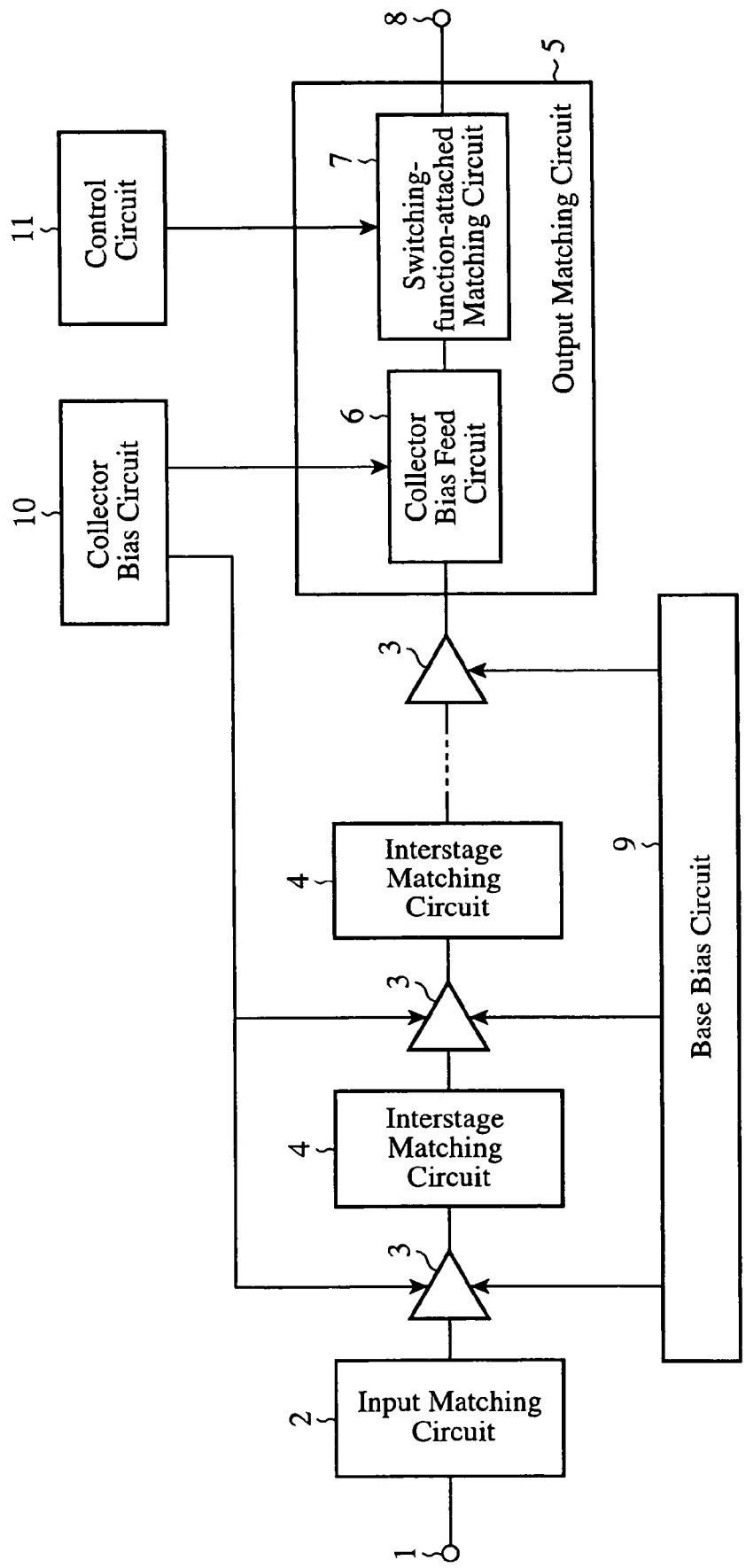
FIG. 1 is a block diagram showing a configuration of the high-power amplifier of an embodiment 1 in accordance with the present invention.

FIG. 1 is a block diagram showing a configuration of a high-power amplifier of an embodiment 1 in accordance with the present invention.

In FIG. 1, an input terminal 1 is a terminal of the high-power amplifier for inputting an input signal. An input matching circuit 2, which is connected between the input terminal 1 and an amplifying element 3, tries to make matching between the input terminal 1 and amplifying element 3.

Each amplifying element 3, which is composed of such a device as an FET, HEMT, HBT and BJT, amplifies the input signal and outputs.

Each interstage matching circuit 4 is connected between two amplifying elements 3 to make matching between them.

An output matching circuit 5 is connected between the final stage amplifying element 3 and an output terminal 8 to make matching between them.

A collector bias feed circuit 6, which is placed in the output matching circuit 5, supplies bias to the collector (or drain) of the final stage amplifying element 3.

A switching-function-attached matching circuit 7, which is placed in the output matching circuit 5, changes matching conditions of the output matching circuit 5 under the control of a control circuit 11. The switching-function-attached matching circuit 7 constitutes a matching condition changing means.

A base bias circuit 9 supplies a base bias (or gate bias) voltage to the base (or gate) of each of the multistage amplifying elements 3.

A collector bias circuit 10 supplies a collector bias (or drain bias) voltage to the collector (or drain) of each of the amplifying elements 3 except for the final stage amplifying element 3. In addition, it supplies a collector bias (or drain bias) voltage to the collector (or drain) of the final stage amplifying element 3 via the collector bias feed circuit 6.

The control circuit 11 controls the switching-function-attached matching circuit 7 in such a manner as to increase the imaginary part of the output load impedance of the final stage amplifying element 3 when the output power of the amplifying element 3 reduces.

Figure 2:
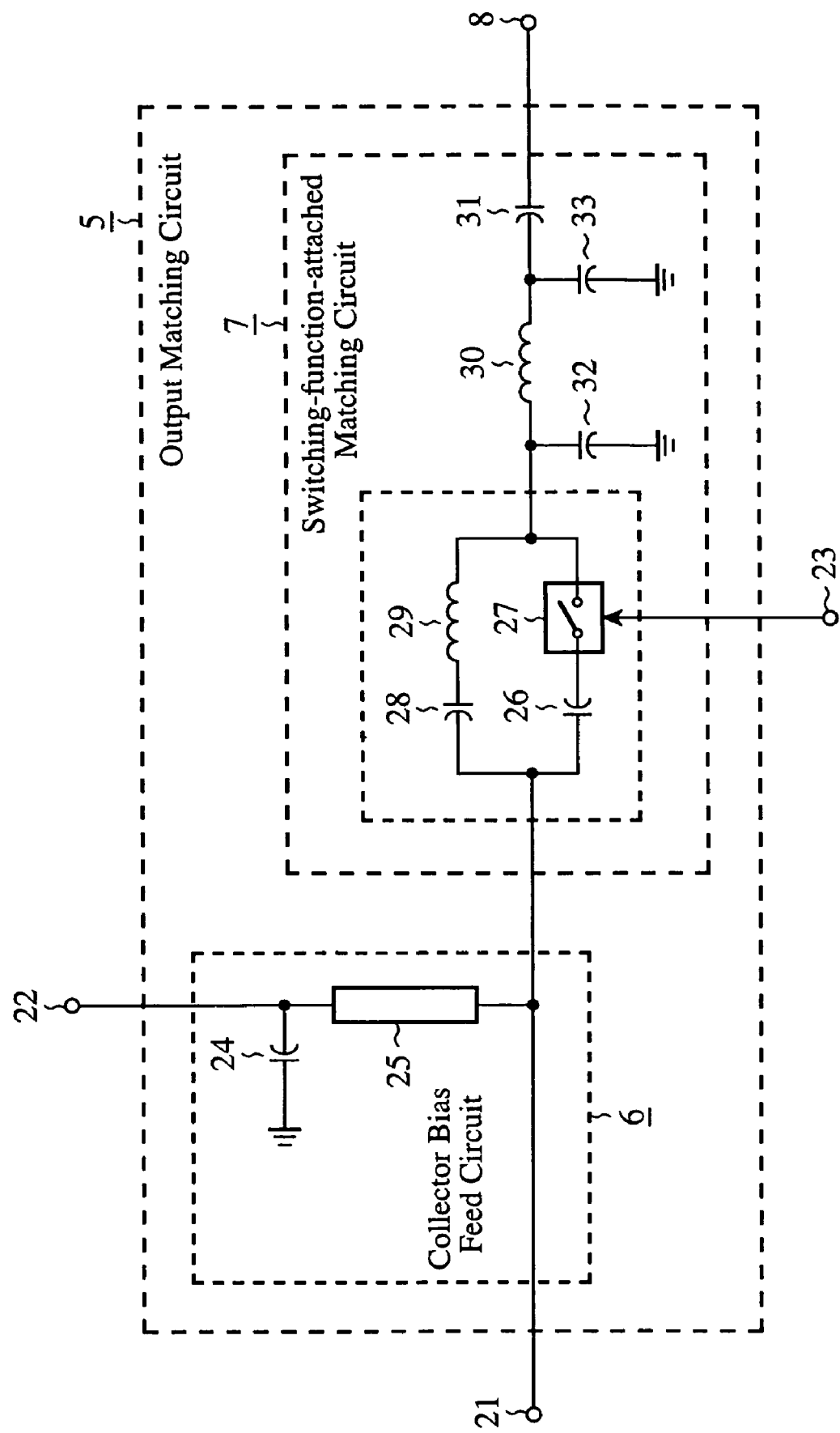
FIG. 2 is a circuit diagram showing an internal configuration of an output matching circuit of the high-power amplifier of the embodiment 1 in accordance with the present invention.

FIG. 2 is a circuit diagram showing an internal configuration of the output matching circuit 5. In FIG. 2, an input terminal 21 is connected to the output terminal of the final stage amplifying element 3, a collector bias terminal 22 is connected to the collector bias circuit 10, and a control terminal 23 is connected to the control circuit 11.

A bypass capacitor 24 of the bias feed circuit 6 has its first terminal connected to the collector bias terminal 22 and its second terminal connected to a ground.

A quarter-wave line 25 of the bias feed circuit 6 has its first terminal connected to the collector bias terminal 22, and its second terminal connected to the input terminal 21.

A series circuit of a DC-cut capacitor 26 and switch 27 constitutes a first impedance circuit, and the switch 27 is turned on and off under the control of the control circuit 11.

A series circuit of a capacitor 28 and inductor 29 constitutes a second impedance circuit that is connected in parallel with the first impedance circuit.

An inductor 30 and capacitor 31 are connected in series with the output terminal 8. Each of capacitors 32 and 33 has its first terminal connected to the inductor 30, and its second terminal connected to the ground.

Next, the operation will be described.

The signal input through the input terminal 1 is supplied to the first stage amplifying element 3 via the input matching circuit 2.

Receiving the input signal from the input matching circuit 2, the first stage amplifying element 3 amplifies the input signal, and supplies the amplified signal to the next stage amplifying element 3 via the interstage matching circuit 4.

Receiving the signal from the previous stage amplifying element 3 via the interstage matching circuit 4, each of the amplifying elements 3 from next stage to the final stage amplifies the signal in the same manner as the first stage amplifying element 3, and outputs it.

The signal output from the final stage amplifying element 3 is output from the output terminal 8 via the output matching circuit 5.

Figure 3:
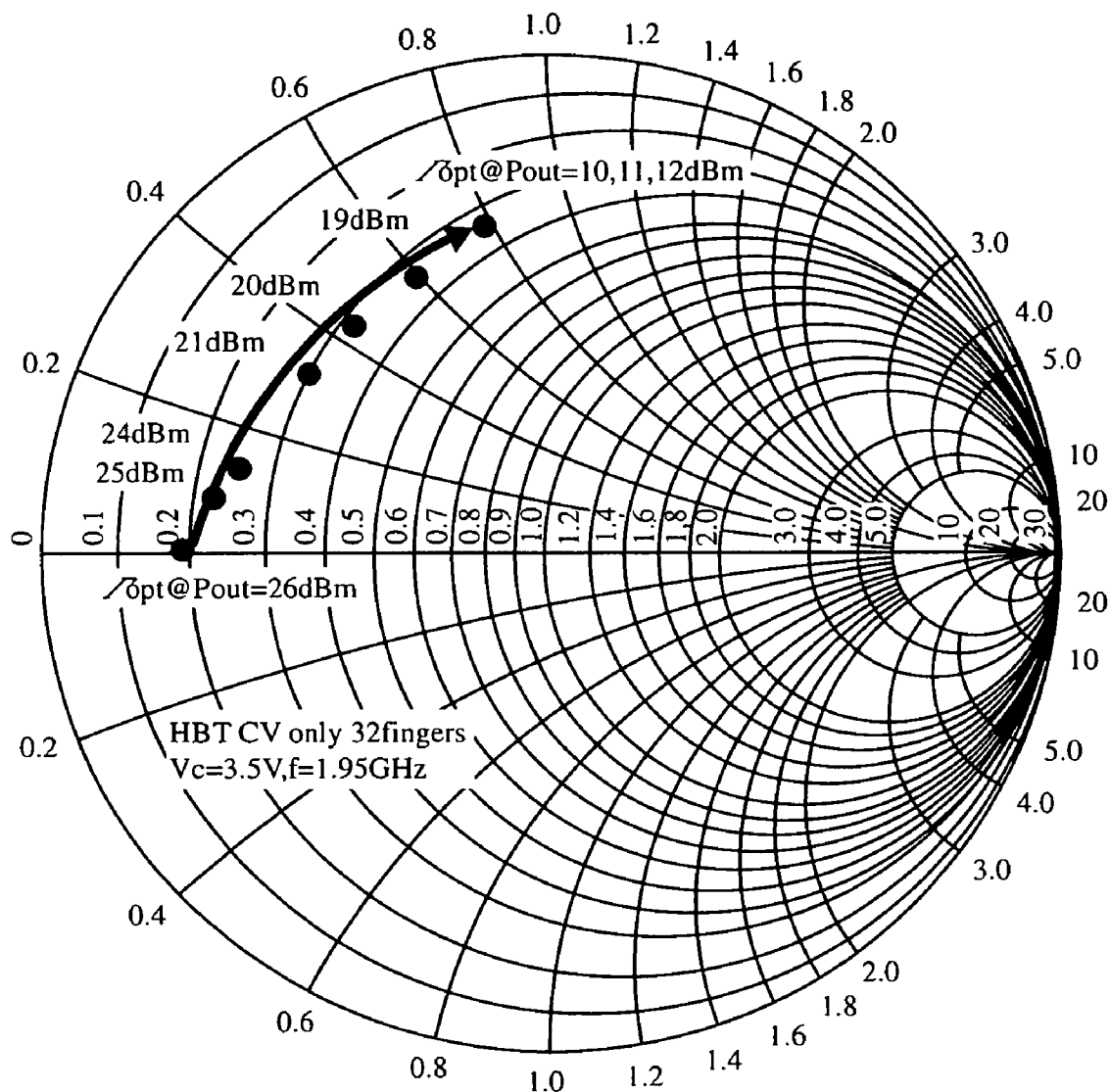
FIG. 3 is a chart illustrating variations in the optimum output load impedance of the final stage amplifying element due to the output power.

FIG. 3 illustrates the calculation results of the optimum output load impedance of the final stage amplifying element 3 due to the variations in the output power. Here, the optimum output load impedance refers to the output load impedance that will maximize the efficiency within the range satisfying a standardized distortion specification.

The amplifying elements 3 used for the calculation are an InGaP HBT (32 fingers with 4×20 μm² per finger); the bias conditions is Vc=3.5 V; the idle collector current is Icq=18 mA; the frequency is 1.95 GHz; and modulation waves for W-CDMA mobile phone terminals are used.

In the example of FIG. 3, an optimum output load impedance is an impedance that will give a maximum efficiency at ACPR<−38 dBc at each output against the W-CDMA modulation waves. The term ACPR (Adjacent Channel leakage Power Ratio) refers to distortion characteristics.

In addition, the optimum output load impedance moves toward the direction that increases the imaginary part of the impedance as the output power is reduced with respect to the maximum output 25 dBm.

FIG. 4 illustrates the calculation results of the efficiency and ACPR values in the case of the optimum output load impedance of FIG. 3 at each output power.

Icq Const. in FIG. 4 refers to the calculation results in the condition where the base voltage is kept constant (Icq is constant). In contrast, Icq Control refers to the results when the idle collector current Icq is controlled to reduced values within the range that meets the condition of ACPR<−38 dBc.

For example, when the output power is reduced to 11 dBm by 14 dB in the condition where the optimum output load impedance at the output power of 25 dBm is maintained, the efficiency becomes 9%.

Therefore it is found from FIG. 4 that when the output power is reduced, the efficiency can be improved from 9% to 18% by implementing the optimum impedance at the output power 11 dBm by increasing the imaginary part of the output load impedance (see FIG. 3).

Thus, in the present embodiment 1, the control circuit 11 observes the output power of the amplifying element 3, and controls, when the output power reduces, the switching-function-attached matching circuit 7 in such a manner as to increase the imaginary part of the output load impedance of the final stage amplifying element 3. Here, although it is assumed that the output power of the final stage amplifying element 3 is observed, it is also possible to observe the output power of other amplifying element 3.

The following is the details.

First, the collector bias feed circuit 6 composed of the bypass capacitor 24 and quarter-wave line 25 is connected to the input terminal 21 of the output matching circuit 5. However, at the used frequency, since the collector bias feed circuit 6 makes open the impedance causing a short circuit at the bypass capacitor 24 by the quarter-wave line 25, the collector bias feed circuit 6 has no effect on the output load impedance of the final stage amplifying element 3.

Accordingly, the output load impedance of the final stage amplifying element 3 is determined by the switching-function-attached matching circuit 7.

The switching-function-attached matching circuit 7 has a circuit including the series circuit of the DC-cut capacitor 26 and switch 27 and the series circuit of the capacitor 28 and inductor 29, which series circuits are connected in parallel.

The control circuit 11 observes the output power of the amplifying element 3, and turns on the switch 27 of the switching-function-attached matching circuit 7 when the output power is greater than predetermined power, thereby causing the output signal of the final stage amplifying element 3 to pass through the DC-cut capacitor 26. In this case, the output signal scarcely flows through the capacitor 28 and inductor 29.

In contrast, when the output power of the amplifying element 3 is less than the predetermined power, the control circuit 11 turns off the switch 27 of the switching-function-attached matching circuit 7 so that the output signal of the final stage amplifying element 3 passes through the capacitor 28 and inductor 29.

In this way, when the output power of the amplifying element 3 reduces, the imaginary part of the output load impedance of the amplifying element 3 is increased as compared when the output power is large.

Therefore when the capacitors 26, 31, 32 and 33 and inductor 30 are designed in such a manner as to implement the optimum load impedance at the maximum output in the case where the switch 27 is made on, the imaginary component can be increased by the difference between the reactance component of the inductor 29 and that of the DC-cut capacitor 26 in the case where the switch 27 is made off. Here, the value of the inductor 29 is set at a value that will implement the optimum load impedance at the low output power when the switch 27 is turned off.

As is clear from the foregoing description, the present embodiment 1 is configured in such a manner as to change the matching conditions of the output matching circuit 5 connected between the final stage amplifying element 3 and output terminal 8 in response to the output power of the amplifying element 3. Thus, the present embodiment 1 offers an advantage of being able to greatly increase the efficiency at the low output power without reducing the efficiency at the maximum output. In addition, since it can obviate the need for the DC-DC converter, it offers an advantage of being able to prevent an increase in size and cost.

Furthermore, the present embodiment 1 is configured in such a manner as to turn on the switch 27 of the switching-function-attached matching circuit 7 when the output power of the amplifying element 3 is greater than the predetermined power, and to turn off the switch 27 of the switching-function-attached matching circuit 7 when the output power of the amplifying element 3 is less than the predetermined power. Thus, the present embodiment 1 offers an advantage of being able to implement the optimum load impedance easily both at the maximum and low output power.

Incidentally, when the switch 27 of the switching-function-attached matching circuit 7 is composed of a diode or transistor, the distortion characteristics are usually worse when the switch 27 is turned off. The present embodiment 1 can control the distortion characteristics caused by the switch 27, because the low output power occurs at the off timing of the switch in which the distortion characteristics are severer.

EMBODIMENT 2

Figure 5:
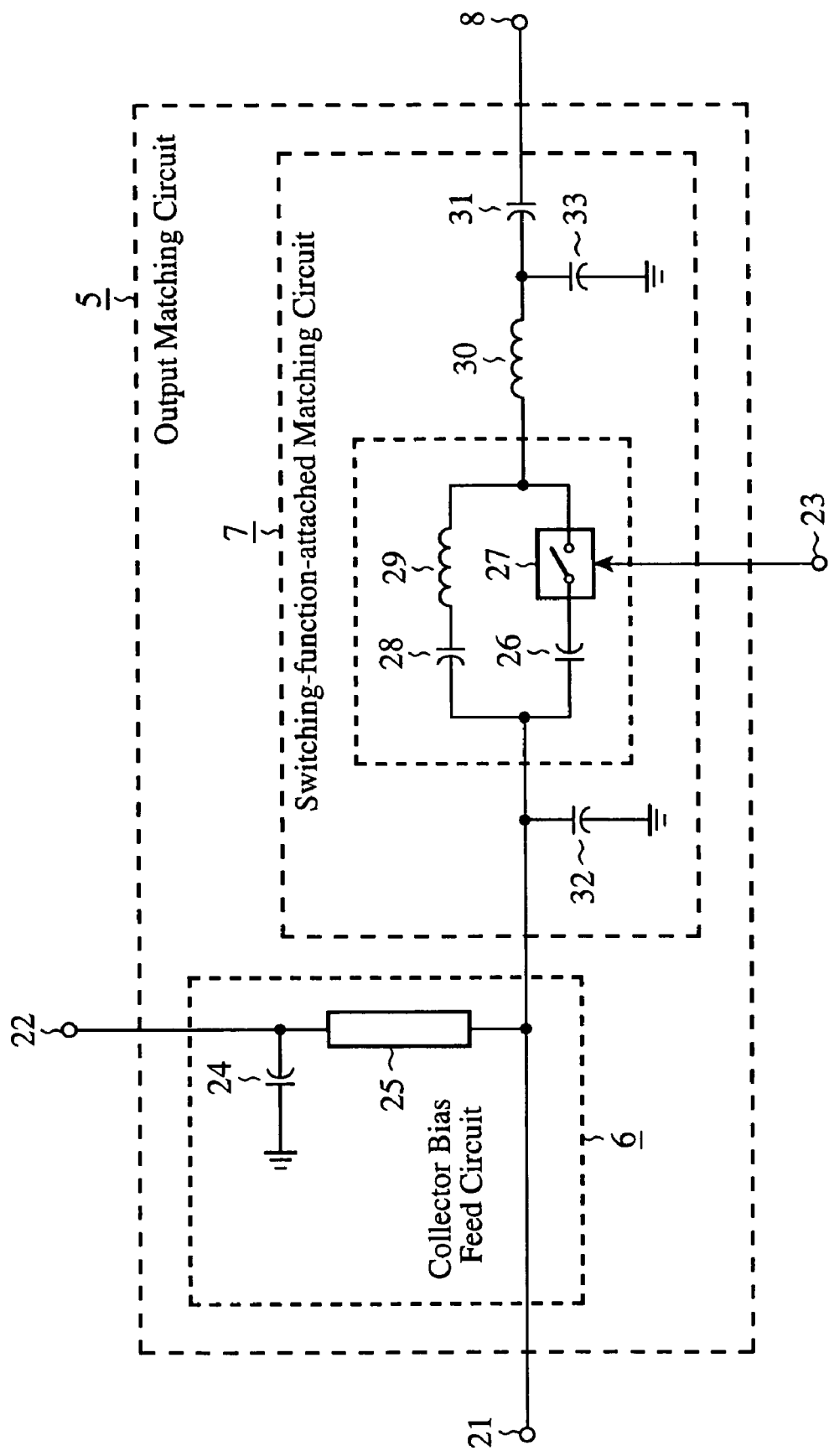
FIG. 5 is a circuit diagram showing an internal configuration of the output matching circuit of the high-power amplifier of an embodiment 2 in accordance with the present invention.

FIG. 5 is a circuit diagram showing an internal configuration of the output matching circuit 5 of the high-power amplifier of an embodiment 2 in accordance with the present invention.

It differs from the output matching circuit 5 of FIG. 2 in that the capacitor 32 of the switching-function-attached matching circuit 7 is moved toward the final stage amplifying element 3 side. Thus, the capacitor 32 is connected in parallel with the collector bias feed circuit 6. Here, a line can be interposed between the collector bias feed circuit 6 and the capacitor 32.

Next, the operation will be described.

The collector bias feed circuit 6 composed of the bypass capacitor 24 and quarter-wave line 25 is connected to the input terminal 21 of the output matching circuit 5. However, since the collector bias feed circuit 6 makes open the impedance causing the short circuit at the bypass capacitor 24 at the used frequency by the quarter-wave line 25, the collector bias feed circuit 6 has no effect on the output load impedance of the final stage amplifying element 3.

In reality, however, it sometimes occurs that the quarter-wave line 25 cannot be achieved up to the full length of the quarter wave, and is shorter than the quarter wave. In this case, the collector bias feed circuit 6 has some effect on the output load impedance of the final stage amplifying element 3.

In the present embodiment 2, the capacitor 32 of the switching-function-attached matching circuit 7 is moved toward the final stage amplifying element 3, and is connected in parallel with the collector bias feed circuit 6. Thus, even if the quarter-wave line 25 is shorter than the quarter wave, the present embodiment 2 can cancel out the parallel inductance component caused by being shorter than the quarter wave.

Therefore the output load impedance of the final stage amplifying element 3 is made free from the effect of the collector bias feed circuit 6, to which the capacitor 32 of the switching-function-attached matching circuit 7 is connected.

In this case, the output load impedance of the final stage amplifying element 3 is determined by the switching-function-attached matching circuit 7 without including the capacitor 32 moved toward the final stage amplifying element 3 side.

Accordingly, when the capacitors 26, 31 and 33 and inductor 30 are designed in such a manner as to implement the optimum load impedance at the maximum output in the case where the switch 27 is made on, the imaginary component can be increased by the difference between the reactance component of the inductor 29 and that of the DC-cut capacitor 26 in the case where the switch 27 is made off. Here, the value of the inductor 29 is set at a value that will implement the optimum load impedance at the low output power when the switch 27 is turned off.

As is clear from the foregoing description, when the bias feed circuit 6 for supplying the bias to the collector of the final stage amplifying element 3 is connected to the input terminal 21 of the output matching circuit 5, the present embodiment 2 is configured in such a manner as to connect the capacitor 32 in parallel with the collector bias feed circuit 6. Thus, even if the quarter-wave line 25 of the collector bias feed circuit 6 cannot be achieved up to the full length of the quarter wave, the present embodiment 2 offers an advantage of being able to cancel out the parallel inductance component caused by being shorter than the quarter wave.

EMBODIMENT 3

Figure 6:
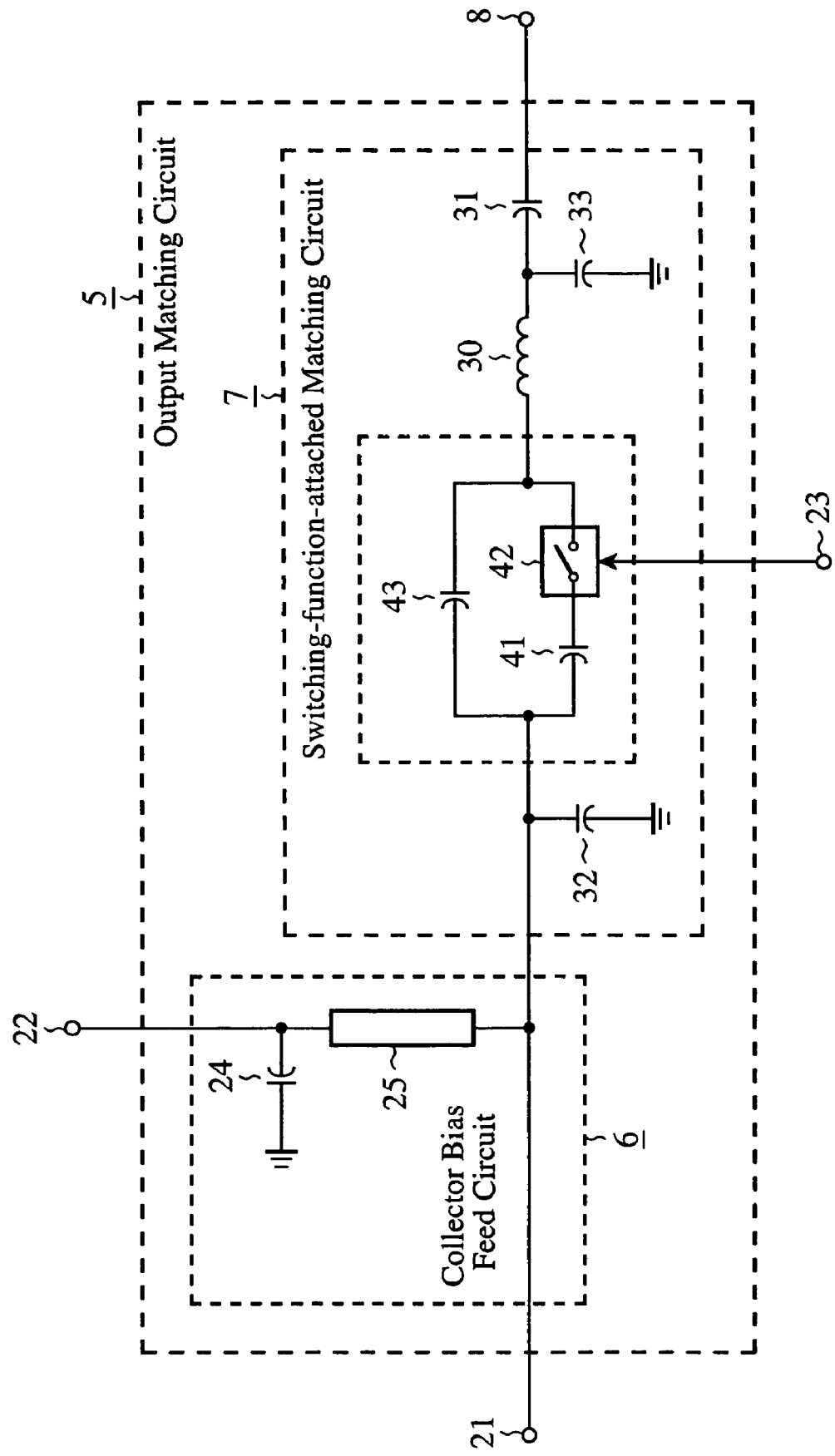
FIG. 6 is a circuit diagram showing an internal configuration of the output matching circuit of the high-power amplifier of an embodiment 3 in accordance with the present invention.

FIG. 6 is a circuit diagram showing an internal configuration of the output matching circuit 5 of the high-power amplifier an embodiment 3 in accordance with the present invention.

In FIG. 6, since the same reference numerals designate the same or like portions to those of FIG. 5, their description will be omitted here.

A series circuit of a DC-cut capacitor 41 and switch 42 constitutes a first impedance circuit, and the switch 42 is turned on and off under the control of the control circuit 11.

A capacitor 43 constitutes a second impedance circuit that is connected in parallel with the first impedance circuit.

Next, the operation will be described.

It sometimes occurs that the quarter-wave line 25 cannot be achieved up to the full length of the quarter wave. Thus, as in the foregoing embodiment 2, the capacitor 32 of the switching-function-attached matching circuit 7 is moved toward the final stage amplifying element 3 side to be connected in parallel with the collector bias feed circuit 6.

Therefore the output load impedance of the final stage amplifying element 3 is free from the effect of the collector bias feed circuit 6, to which the capacitor 32 of the switching-function-attached matching circuit 7 is connected.

In this case, the output load impedance of the final stage amplifying element 3 is determined by the switching-function-attached matching circuit 7 without the capacitor 32 moved toward the final stage amplifying element 3 side.

The control circuit 11 observes the output power of the amplifying element 3, and turns off the switch 42 of the switching-function-attached matching circuit 7 when the output power is greater than predetermined power, thereby causing the output signal of the final stage amplifying element 3 to pass through the capacitor 43.

In contrast, when the output power of the amplifying element 3 is less than the predetermined power, the control circuit 11 turns on the switch 42 of the switching-function-attached matching circuit 7 so that the output signal of the final stage amplifying element 3 passes through both the capacitor 41 and capacitor 43, thereby increasing the value of the series capacitors.

In this way, when the output power of the amplifying element 3 reduces, the imaginary part of the output load impedance of the amplifying element 3 is increased as compared when the output power is large.

Therefore when the capacitors 31, 33 and 43 and inductor 30 are designed in such a manner as to implement the optimum load impedance at the maximum output in the case where the switch 42 is made off, the imaginary component of the output load impedance can be increased in the case where the switch 27 is made on. Here, the value of the capacitor 43 is set at a value that will implement the imaginary component of the difference between the optimum impedance at the maximum output and the optimum impedance at the low output power.

As is clear from the foregoing description, the present embodiment 3 is configured in such a manner as to turn off the switch 42 of the switching-function-attached matching circuit 7 when the output power of the amplifying element 3 is greater than the predetermined power, and to turn on the switch 42 of the switching-function-attached matching circuit 7 when the output power of the amplifying element 3 is less than the predetermined power. Thus, the present embodiment 3 offers an advantage of being able to implement the optimum load impedance easily at both the maximum and low output power.

In addition, since the present embodiment 3 can eliminate the inductor 29, it offers an advantage of being able to miniaturize the high-power amplifier.

Furthermore, the present embodiment 3 offers an advantage of being able to prevent the reduction in the efficiency at the maximum output, because the switch 42 of the switching-function-attached matching circuit 7 is made off when the output power of the amplifying element 3 is greater than the predetermined power.

EMBODIMENT 4

Figure 7:
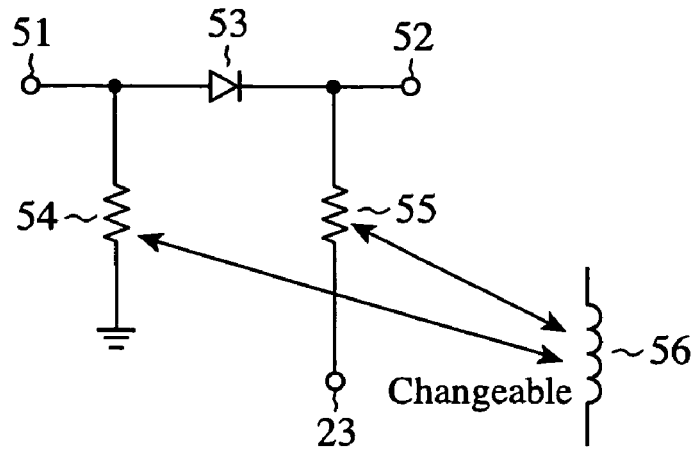
FIG. 7 is a circuit diagram showing an internal configuration of a switch of the high-power amplifier of an embodiment 4 in accordance with the present invention.

FIG. 7 is a circuit diagram showing an internal configuration of the switch 27 or 42 of the high-power amplifier of an embodiment 4 in accordance with the present invention.

In FIG. 7, a diode 53 such as a PIN diode, Schottky diode or PN diode is connected between an input terminal 51 and an output terminal 52.

A bias feed resistor 54 has its first terminal connected to the input terminal 51, and its second terminal connected to the ground.

A bias feed resistor 55 has its first terminal connected to the output terminal 52, and its second terminal connected to the control terminal 23.

Next, the operation will be described.

The switch 27 or 42 of the switching-function-attached matching circuit 7 is implemented by turning on and off the bias of the diode 53. To feed the bias to the diode 53, it is possible to use the bias feed resistors 54 and 55, or bias feed inductors 56 as shown in FIG. 7.

Using the bias feed resistors 54 and 55, however, can miniaturize the high-power amplifier in its entirety, because they can be formed on the same semiconductor substrate as the amplifying elements 3.

In addition, when the Schottky diode or PN diode is used as the diode 53, and a contrivance is made to construct the Schottky diode with using the source and drain electrodes of an FET in common, or the PN diode with using the emitter and collector of a BJT or HBT in common, the diode 53 can be easily formed on the same substrate as the amplifying elements 3, thereby being able to miniaturize the high-power amplifier in its entirety. The miniaturization can also bring about the cost reduction.

To turn on the diode 53, the control circuit 11 applies a positive voltage to the control terminal 23.

In contrast, to turn off the diode 53, the control circuit 11 applies a zero or negative voltage to the control terminal 23.

When the signal input to the diode 53 is large, the distortion characteristics deteriorate, particularly when turning off the diode 53. In such a case, it is necessary to apply the negative voltage.

When using the PIN diode as the diode 53, it is possible to turn on the diode 53 with a less diode current than when using the Schottky diode or PN diode, thereby being able to reduce the current consumption of the diode 53. In this case, an advantage is offered of being able to increase the efficiency of the high-power amplifier in its entirety.

EMBODIMENT 5

Figure 8:
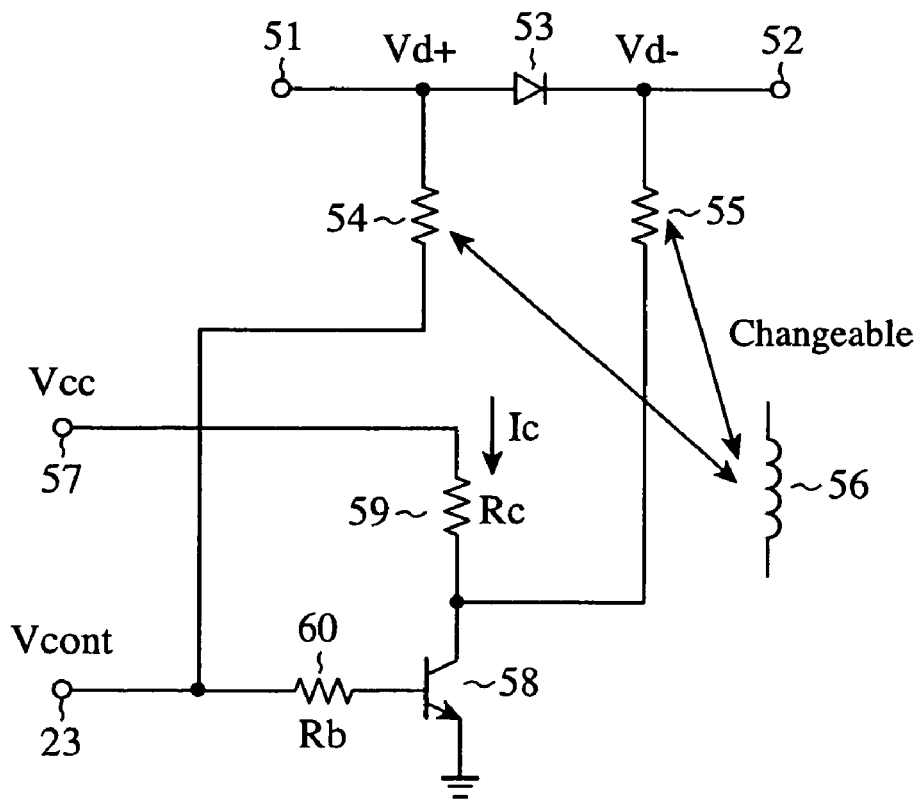
FIG. 8 is a circuit diagram showing an internal configuration of the switch of the high-power amplifier of an embodiment 5 in accordance with the present invention.

FIG. 8 is a circuit diagram showing an internal configuration of the switch 27 or 42 of the high-power amplifier of an embodiment 5 in accordance with the present invention.

In FIG. 8, since the same reference numerals designate the same or like portions to those of FIG. 7, their description will be omitted here.

A power supply voltage application terminal 57 is supplied with a power supply voltage Vcc. A transistor 58 constitutes a transistor switch consisting of a BJT, HBT or FET, for example.

A resistor 59, whose resistance value is Rc, has its first terminal connected to the power supply voltage application terminal 57, and its second terminal connected to the collector of the transistor 58.

A resistor 60, whose resistance value is Rb, has its first terminal connected to the control terminal 23, and its second terminal connected to the base of the transistor 58.

Next, the operation will be described.

The switch 27 or 42 of the switching-function-attached matching circuit 7 is implemented by turning on and off the bias of the diode 53.

To turn on the diode 53, the control circuit 11 applies a positive voltage to the control terminal 23 as in the foregoing embodiment 4. However, to prevent the deterioration in the distortion characteristics at turning off the diode 53, it is necessary to apply a negative voltage.

However, considering a demand for carrying out everything by using positive voltages, the present embodiment 5 devises a method of preventing the deterioration in the distortion characteristics in the off state even if the control circuit 11 applies zero volt to the control terminal 23.

The following is the details.

First, the power supply voltage application terminal 57 is always supplied with the positive power supply voltage Vcc.

When the control circuit 11 applies the control voltage Vcont of zero volt to the control terminal 23, the transistor 58 is turned off. Thus, no current flows through the transistor 58 so that the output side voltage Vd− of the transistor 58 agrees with the power supply voltage Vcc.

In addition, the input side voltage Vd+ of the transistor 58 is placed at zero volt, because it is identical to the control voltage Vcont.

Accordingly the diode 53 is supplied with the negative voltage −Vcc.

On the other hand, when the control circuit 11 supplies a positive control voltage Vcont (such as +2.5 V) to the control terminal 23, the transistor 58 is turned on and a current Ic flows through the transistor 58.

Accordingly, the output side voltage Vd− of the transistor 58 becomes the difference obtained by subtracting the voltage drop by the resistor 59 from the power supply voltage Vcc, that is, Vcc−Rc×Ic. When the resistance value Rc of the resistor 59 is large, the output side Vd− of the transistor 58 becomes about 0.5 V, which is the knee voltage of the transistor 58.

On the other hand, the input side voltage Vd+ of the transistor 58 is identical to the control voltage Vcont itself, and is +2.5 V, for example.

Accordingly, the diode 53 is supplied with a positive voltage of +2.0 V.

Figure 9:
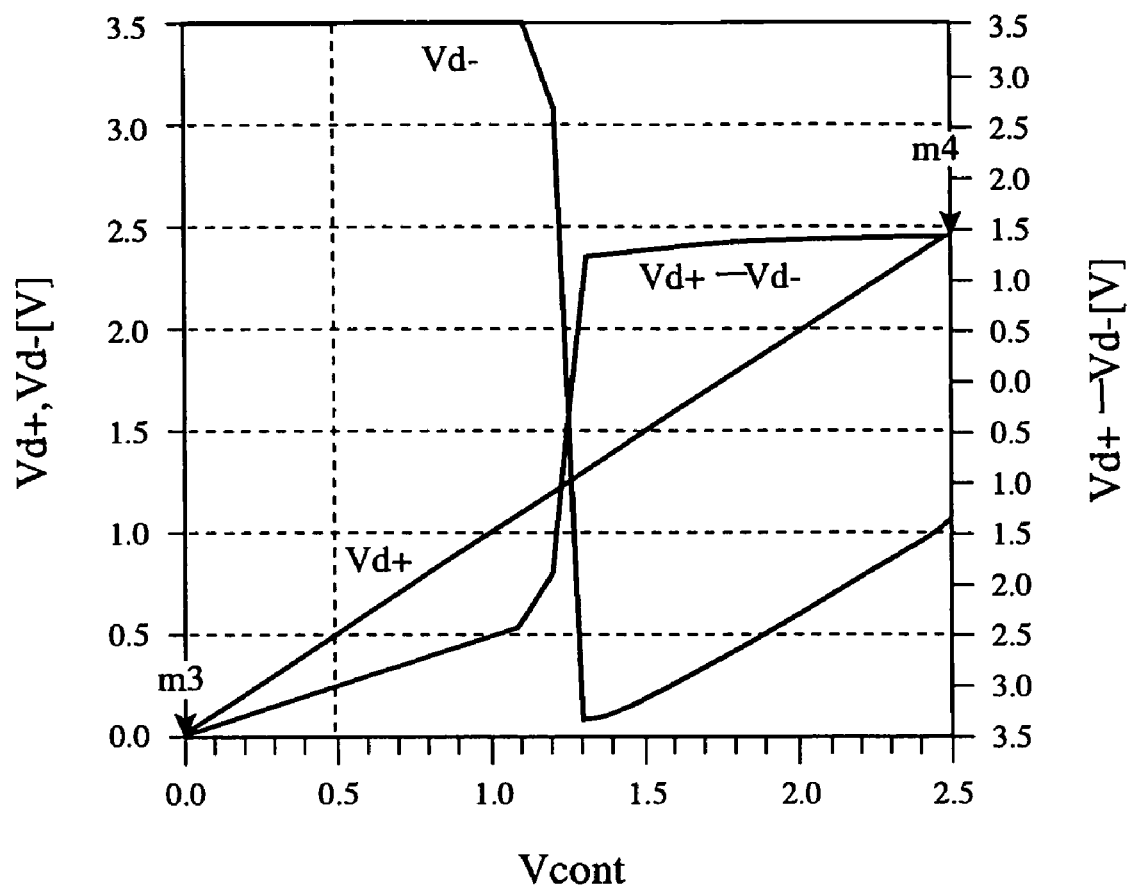
FIG. 9 is a diagram illustrating calculation results of circuit voltages.

FIG. 9 illustrates the calculation results of the circuit voltages, and shows that it is possible to supply the diode 53 with the positive polarity and negative polarity voltages using only positive voltage.

Thus, the present embodiment 5 can operate the diode 53 at low distortion using only positive voltage for the control.

In addition, since the present embodiment 5 is configured using only the resistors and transistor, it can be constructed on the same substrate as the amplifying elements 3, thereby being able to miniaturize the high-power amplifier.

EMBODIMENT 6

Figure 10:
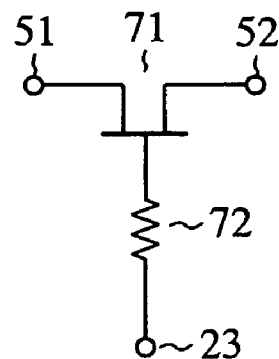
FIG. 10 is a circuit diagram showing an internal configuration of the switch of the high-power amplifier of an embodiment 6 in accordance with the present invention.

FIG. 10 is a circuit diagram showing an internal configuration of the switch of the high-power amplifier of an embodiment 6 in accordance with the present invention.

In FIG. 10, since the same reference numerals designate the same or like portions to those of FIG. 7, their description will be omitted here.

A transistor 71, which is a transistor such as a BJT, HBT or FET, is connected between the input terminal 51 and output terminal 52.

A resistor 72 has its first terminal connected to the base of the transistor 71, and its second terminal connected to the control terminal 23.

Next, the operation will be described.

The control circuit 11 controls the voltage to be applied to the control terminal 23. Thus, it can turn on and off the transistor 71.

Thus, the transistor 71 operates as a switch. In this case, the pass loss due to the control terminal 23 side impedance can be made small because the transistor 71 can provide sufficient isolation between the path through which the control signal input via the control terminal 23 passes and the path through which the signal input via the input terminal 51 passes.

Therefore the present embodiment 6 can achieve higher efficiency than the foregoing embodiment 3. At the same time, when a mechanical switch such as a MEMS switch is used in place of the transistor 71, the efficiency of the high-power amplifier can be further improved because of the small pass loss of the MEMS switch.

EMBODIMENT 7

Figure 11:
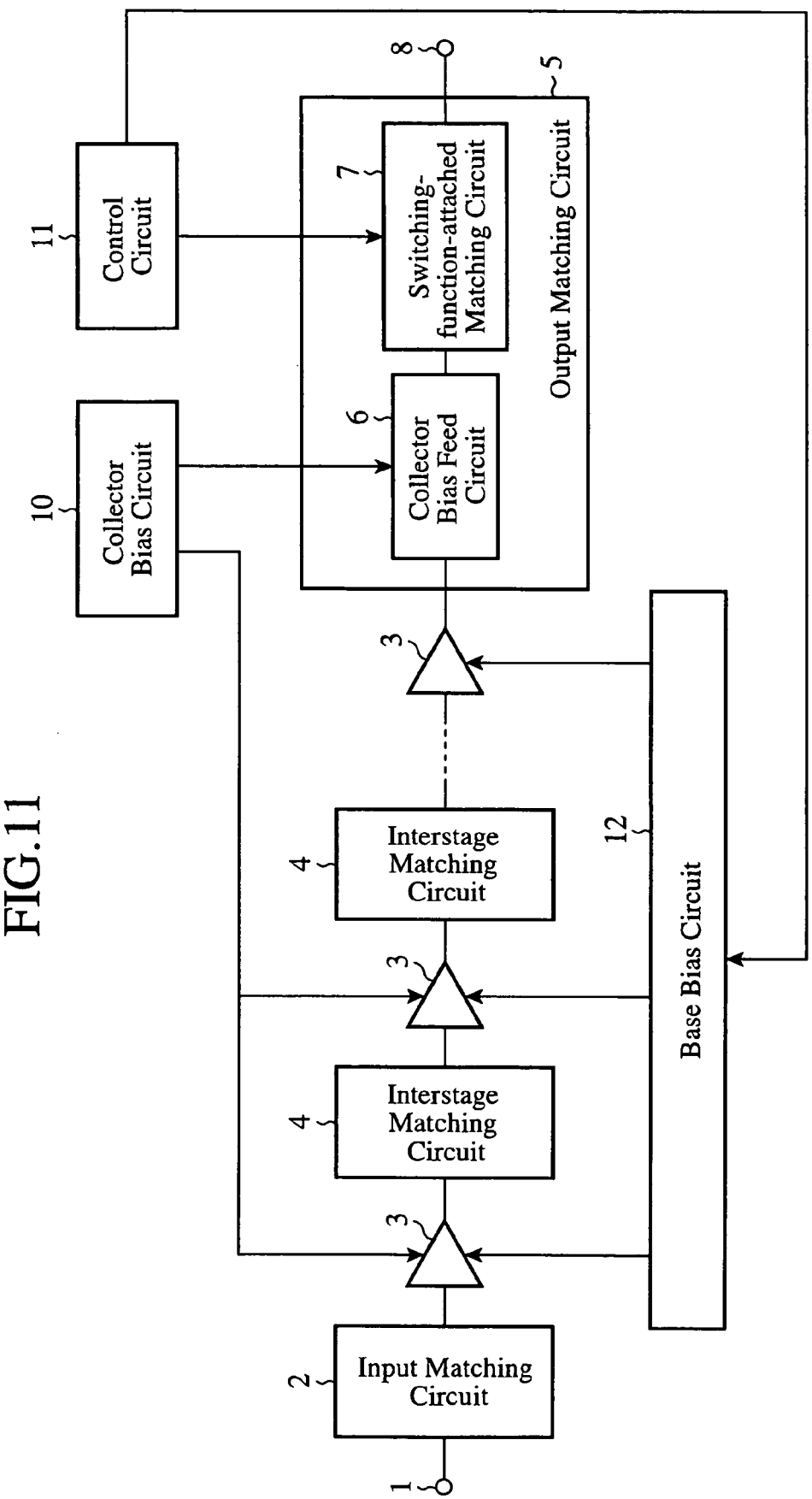
FIG. 11 is a block diagram showing a configuration of the high-power amplifier of an embodiment 7 in accordance with the present invention.

FIG. 11 is a block diagram showing a configuration of the high-power amplifier of an embodiment 7 in accordance with the present invention.

In FIG. 11, since the same reference numerals designate the same or like portions to those of FIG. 1, their description will be omitted here.

A base bias circuit 12 controls, under the control of the control circuit 13, the base bias (or gate bias) voltage to be supplied to the base (or gate) of each amplifying element 3. Here, the base bias circuit 12 constitutes a voltage control means.

As the control circuit 11 of FIG. 1, the control circuit 13 controls the switching-function-attached matching circuit 7 in such a manner as to increase the imaginary part of the output load impedance of the final stage amplifying element 3 when the output power of the amplifying element 3 reduces, and controls the base bias circuit 12 in such a manner as to reduce the idle current of each amplifying element 3 when the output power of the amplifying element 3 reduces.

Next, the operation will be described.

The present embodiment 7 differs from the foregoing embodiment 1 in that when the output power of the amplifying element 3 reduces, the present embodiment 7 not only controls the switching-function-attached matching circuit 7 in such a manner as to increase the imaginary part of the output load impedance of the final stage amplifying element 3, but also controls the base bias circuit 12 in such a manner as to reduce the idle current of the amplifying elements 3.

The different point will be described in more detail.

FIG. 4 shows the calculation results of the Icq Control when the idle collector current Icq is reduced in the range that satisfies ACPR<−38 dBc. Thus, when switching the output load impedance between the maximum output and the low output power as illustrated in FIG. 3, the efficiency at the low output power can be further increased by reducing the idle current of the collector at the low output power by controlling the base bias voltage of the amplifying elements 3 as shown in FIG. 4.

In view of this, in the present embodiment 7, the control circuit 13 observes the output power of the amplifying element 3, and supplies the base bias circuit 12 with the control signal instructing to reduce the idle current of the amplifying elements 3 when the output power becomes less than the predetermined power.

Receiving the control signal instructing to reduce the idle current from the control circuit 13, the base bias circuit 12 increases the base bias voltages supplied to the bases of the amplifying elements 3, thereby reducing the idle current of the amplifying elements 3.

As is clear from the foregoing description, the present embodiment 7 is configured in such a manner as to control the base bias voltages of the amplifying elements 3 in such a fashion as to reduce the idle current of the amplifying elements 3 when the output power of the amplifying element 3 reduces. Thus, the present embodiment 7 offers an advantage of being able to increase the efficiency at the low output power further than the foregoing embodiment 1.

EMBODIMENT 8

Figure 12:
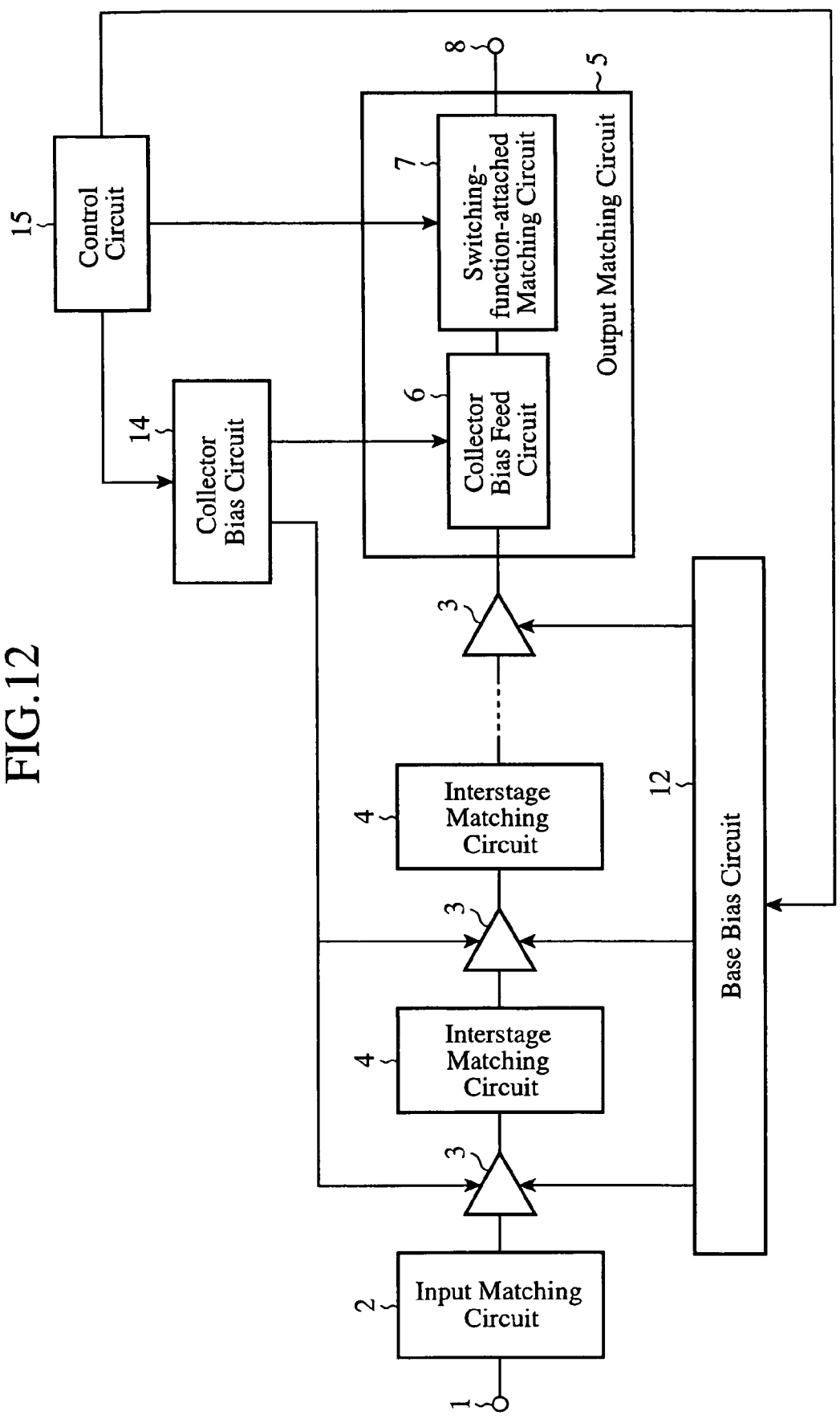
FIG. 12 is a block diagram showing a configuration of the high-power amplifier of an embodiment 8 in accordance with the present invention.

FIG. 12 is a block diagram showing a configuration of the high-power amplifier of an embodiment 8 in accordance with the present invention.

In FIG. 12, since the same reference numerals designate the same or like portions to those of FIG. 11, their description will be omitted here.

A collector bias circuit 14 controls the collector bias (or drain bias) voltage supplied to the collector (or drain) of each amplifying element 3 under the control of a control circuit 15. The collector bias circuit 14 constitutes a voltage control means.

Just as the control circuit 13 of FIG. 11, when the output power of the amplifying element 3 reduces, the control circuit 15 controls the switching-function-attached matching circuit 7 in such a manner as to increase the imaginary part of the output load impedance of the final stage amplifying element 3, and the base bias circuit 12 in such a manner as to reduce the idle current of the amplifying elements 3. In addition, the control circuit 15 controls the collector bias circuit 14 when the output power of the amplifying element 3 reduces.

Next, the operation will be described.

The present embodiment 8 differs from the foregoing embodiment 7 in that when the output power of the amplifying element 3 reduces, the present embodiment 8 not only controls the base bias circuit 12 in such a manner as to reduce the idle current of the amplifying elements 3, but also reduces the collector bias voltage of the amplifying elements 3.

The different point will be described in more detail below.

The efficiency at the low output power can be further increased without reducing the efficiency at the maximum output by reducing the collector bias voltage of the amplifying elements 3 within the range in which ACPR indicating the distortion characteristics satisfies the standards.

In view of this, in the present embodiment 8, the control circuit 15 observes the output power of the amplifying element 3, and supplies, when the output power falls below the predetermined power, the collector bias circuit 14 with the control signal instructing to reduce the collector bias voltage of the amplifying elements 3.

Receiving the control signal instructing to reduce the collector bias voltage of the amplifying elements 3 from the control circuit 15, the collector bias circuit 14 reduces the collector bias voltage supplied to the collectors of the amplifying elements 3.

As is clear from the foregoing description, the present embodiment 8 is configured in such a manner as to reduce the collector bias voltage of the amplifying elements 3 when the output power of the amplifying element 3 reduces. Thus, the present embodiment 8 offers an advantage of being able to increase the efficiency at the low output power further than the foregoing embodiment 7.

Although the present embodiment 8 is described by way of example in which the collector bias circuit 14 controls the collector bias voltage of the amplifying elements 3, it is also possible to use a DC-DC converter or Class S modulator in place of the collector bias circuit 14.

EMBODIMENT 9

Figure 13:
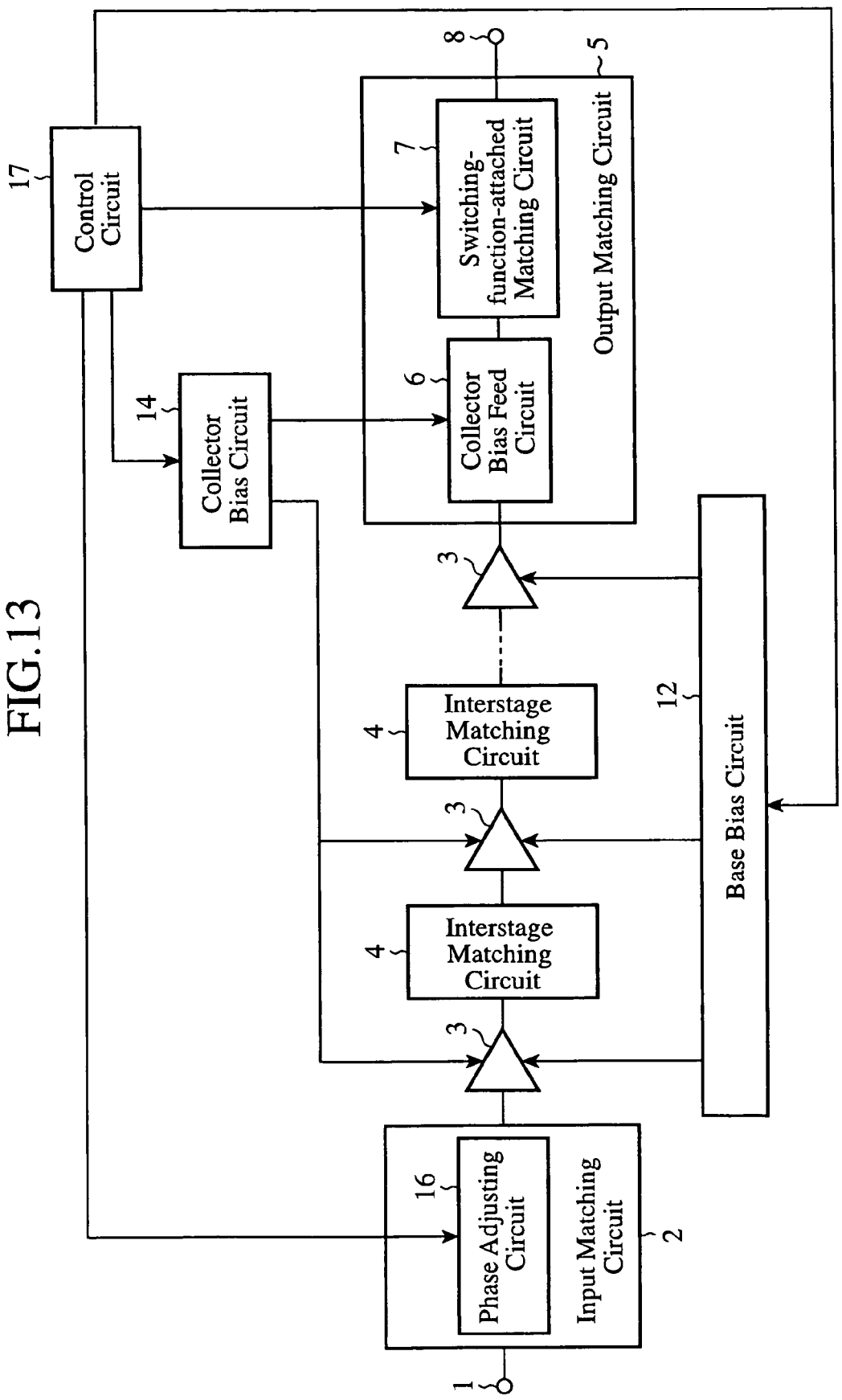
FIG. 13 is a block diagram showing a configuration of the high-power amplifier of an embodiment 9 in accordance with the present invention.

FIG. 13 is a block diagram showing a configuration of the high-power amplifier of an embodiment 9 in accordance with the present invention.

In FIG. 13, since the same reference numerals designate the same or like portions to those of FIG. 12, their description will be omitted here.

A phase adjusting circuit 16 adjusts, under the control of the control circuit 17, the pass phase of the input signal in such a manner as to reduce the fluctuations in the pass phase when the matching conditions of the output matching circuit 5 are changed.

Although the phase adjusting circuit 16 is placed in the input matching circuit 2 in the example of FIG. 13, this is not essential. For example, even if the phase adjusting circuit 16 is placed in the interstage matching circuit 4, it can adjust the pass phase of the input signal in such a manner as to reduce the fluctuations in the pass phase at the changes in the matching conditions of the output matching circuit 5.

The control circuit 17 controls not only the switching-function-attached matching circuit 7, base bias circuit 12 and collector bias circuit 14 just as the control circuit 15 of FIG. 12, but also the phase adjusting circuit 16.

Figure 14:
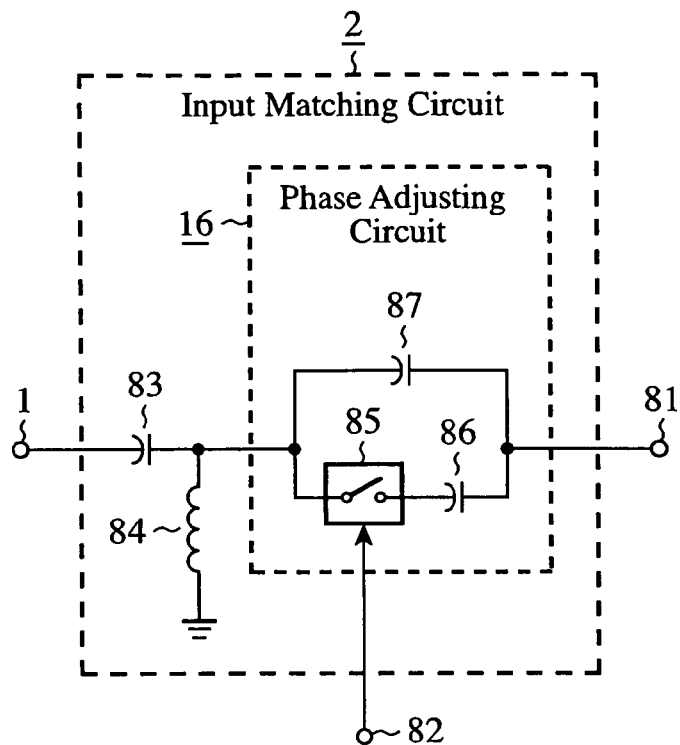
FIG. 14 is a circuit diagram showing an internal configuration of an input matching circuit.

FIG. 14 is a circuit diagram showing an internal configuration of the input matching circuit 2. In FIG. 14, an output terminal 81 is connected to the first stage amplifying element 3, and a control terminal 82 is connected to the control circuit 17.

A capacitor 83 has its first terminal connected to the input terminal 1, and its second terminal connected to the phase adjusting circuit 16.

An inductor 84 has its first terminal connected to the second terminal of the capacitor 83, and its second terminal connected to the ground.

A switch 85 undergoes the on and off control by the control circuit 17. A capacitor 86, which is connected in series with the switch 85, has a capacitance value of Con.

A capacitor 87, which is connected in parallel with the series circuit composed of the switch 85 and capacitor 86, has a capacitance value of Coff.

Next, the operation will be described.

The present embodiment 9 differs from the foregoing embodiment 8 in that the input matching circuit 2 includes the phase adjusting circuit 16.

The different point will be described in more detail below.

Figure 17:
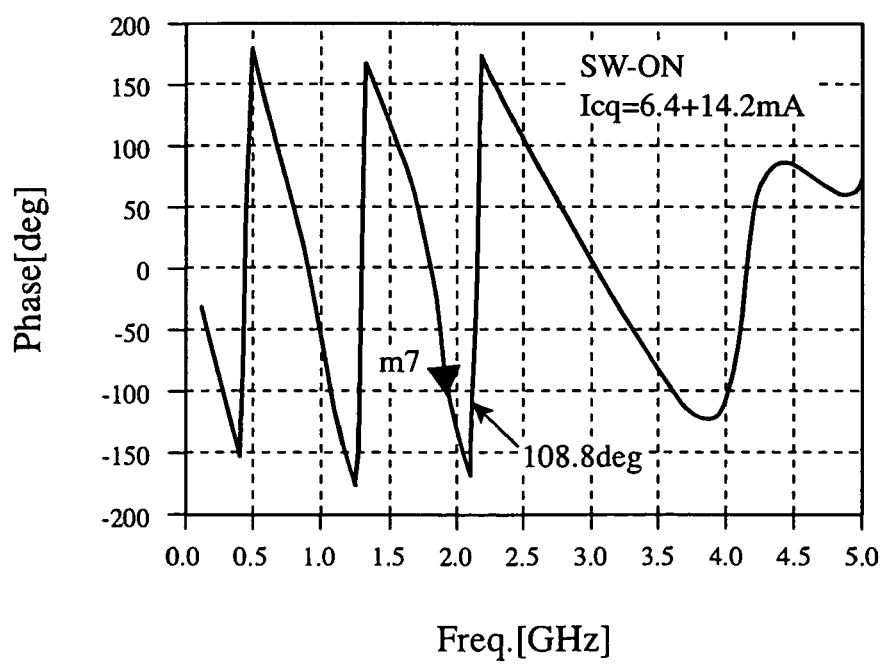
FIG. 17 is a diagram illustrating fluctuations in the pass phase characteristics of the high-power amplifier when reducing an idle collector current by decreasing a base voltage.
Figure 18:
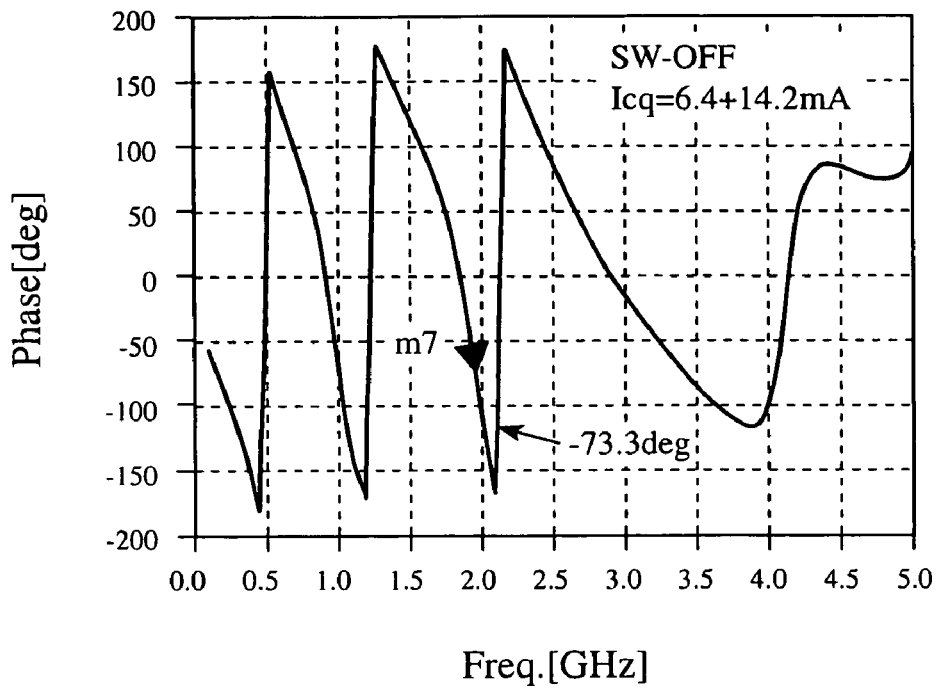
FIG. 18 is a diagram illustrating fluctuations in the pass phase characteristics of the high-power amplifier when reducing the idle collector current by decreasing the base voltage.
Figure 19:
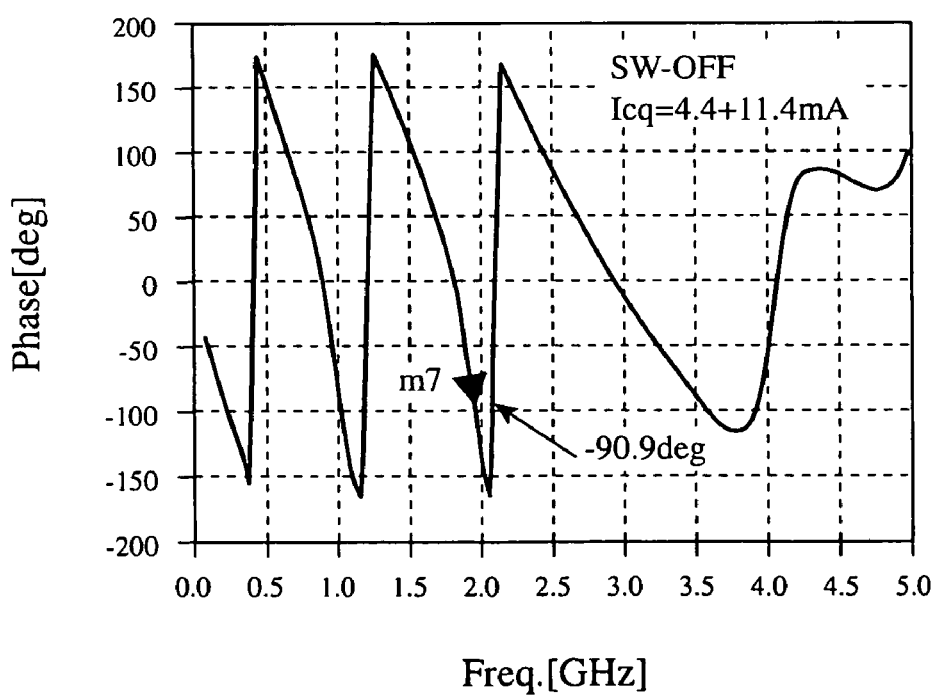
FIG. 19 is a diagram illustrating fluctuations in the pass phase characteristics of the high-power amplifier when reducing the idle collector current by decreasing the base voltage.

FIG. 17 to FIG. 19 each illustrates calculation results of the fluctuations in the pass phase characteristics of the high-power amplifier when the idle collector current is reduced by dropping the base voltage when switching the output matching circuit 5 at the low output power in a two-stage amplifier using an HBT.

Here, the calculation is carried out assuming that the switch 27 of FIG. 5 is used as the circuit for switching the impedance in the output matching circuit 5.

In particular, FIG. 17 illustrates the calculation results of the pass phase characteristics at the maximum output condition, that is, when the switch 27 is in the on state and before the bias conditions are changed.

FIG. 18 illustrates the calculation results when the switch 27 is turned off at the low output power.

FIG. 19 illustrates the calculation results when the idle collector current is reduced by varying the bias conditions in addition to the turning off of the switch 27.

As is clear from FIG. 17 to FIG. 19, the pass phase characteristics at 1.95 GHz vary by +35.5 degrees from −108.8 degrees to −73.3 degrees by switching the output matching circuit 5.

In addition, it is found that the pass phase characteristics vary by +17.9 degrees from −108.8 degrees to −90.9 degrees by varying both the output matching circuit 5 and bias conditions simultaneously.

When the pass phase of the signal changes greatly in communications equipment, in particular in a receiver utilizing a synchronous detection method, it is likely that synchronization error occurs and the communication is interrupted. Accordingly, the fluctuations in the pass phase characteristics must be kept small, and hence the phase fluctuations must be reduced in the high-power amplifier as well.

Thus, the present embodiment 9 has the phase adjusting circuit 16 placed in the input matching circuit 2 to reduce the fluctuations in the pass phase.

The control circuit 17 observes the output power of the amplifying element 3, and turns on the switch 85 of the phase adjusting circuit 16 when the output power is greater than the predetermined power (when the switch 27 of FIG. 5 is in the on state).

In contrast, when the output power of the amplifying element 3 is less than the predetermined power (when the switch 27 of FIG. 5 is in the off state), the control circuit 17 turns off the switch 85 of the phase adjusting circuit 16.

Thus, the input matching of the high-power amplifier is carried out by the capacitors 83, 86 and 87 and inductor 84 at the high output in which the switch 85 of the phase adjusting circuit 16 is in the on state.

In contrast, at the low output power in which the switch 85 of the phase adjusting circuit 16 is in the off state, the input matching is carried out by the capacitors 83 and 87 and inductor 84.

Therefore at the high output in which the switch 85 of the phase adjusting circuit 16 is in the on state, the total capacitance value Con+Coff of the capacitors 86 and 87 is set in such a manner as to achieve the input matching in the state of the maximum output.

In addition, the ratio between the capacitance value Con of the capacitor 86 and the capacitance value Coff of the capacitor 87 is determined to cancel out the pass phase fluctuations caused by the switching of the output matching or of the bias conditions at the low output power.

Figure 20:
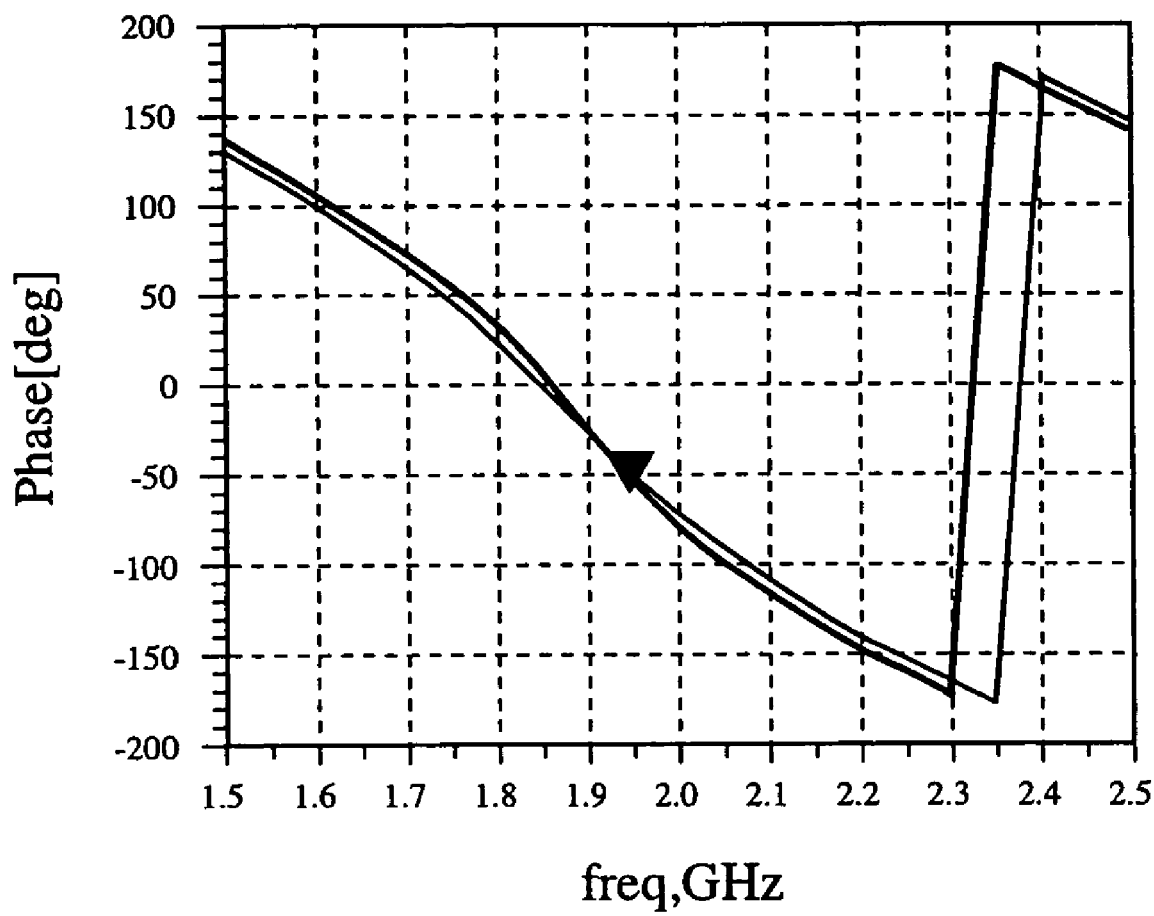
FIG. 20 is a diagram illustrating fluctuations in the pass phase of a two-stage HBT high-power amplifier when turning the switch on and off with varying the ratio between Con and Coff.
Figure 20:
Figure 21:
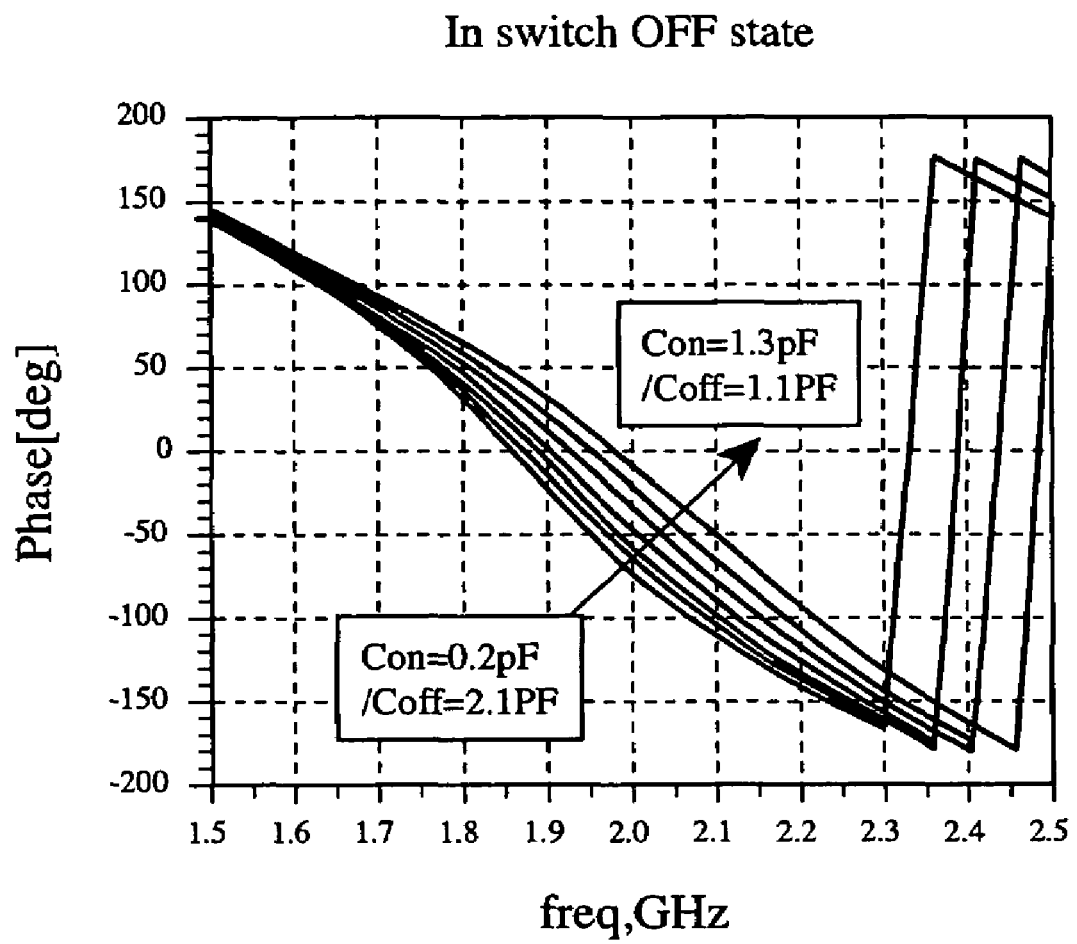
FIG. 21 is a diagram illustrating fluctuations in the pass phase of the two-stage HBT high-power amplifier when turning the switch on and off with varying the ratio between Con and Coff.

FIG. 20 and FIG. 21 illustrate calculation results of the pass phase fluctuations in the two-stage HBT high-power amplifier when the switch 85 is turned on and off in the case where the ratio between Con and Coff varies under the condition in which Con+Coff=2.3 pF is kept constant.

In particular, FIG. 20 illustrates the calculation results when the switch 85 is in the on state; and FIG. 21 illustrates the calculation results when the switch 85 is in the off state.

FIG. 20 and FIG. 21 each illustrate examples in which the combinations of Con/Coff are 0.2 pF/2.1 pF, 0.4 pF/1.9 pF, 0.6 pF/1.7 pF, 0.8 pF/1.5 pF, 1.0 pF/1.3 pF and 1.2 pF/1.1 pF.

It is found from FIG. 20 that the pass phase little varies when the switch 85 is in the on state because Con+Coff=2.3 pF is constant.

In contrast, it is found from FIG. 21 that the pass phase fluctuations in the negative direction increase as the ratio of the Con increases when the switch 85 is in the off state.

Thus, it is found that the phase varies in the direction opposite to the direction resulting from the output matching switching and bias condition switching illustrated in FIG. 17 to FIG. 19.

In view of this, setting the values of Con and Coff appropriately makes it possible to reduce the pass phase fluctuations with maintaining the input matching.

As is clear from the foregoing description, the present embodiment 9 has the phase adjusting circuit 16 for adjusting the pass phase of the input signal in the input matching circuit 2 of the amplifying element 3 in order to reduce the pass phase fluctuations at the time when the matching conditions of the output matching circuit 5 are changed. Thus, the present embodiment 9 offers an advantage of being able to reduce the pass phase fluctuations even when the matching conditions of the output matching circuit 5 are changed.

Although the present embodiment 9 is described by way of example in which the phase adjusting circuit 16 is placed in the input matching circuit 2, the phase adjusting circuit 16 can also be placed in the interstage matching circuit 4.

In this case, since the phase adjusting circuit 16 is placed neither on the input side or output side of the high-power amplifier, deterioration in the noise characteristics or efficiency characteristics due to the loss of the phase adjusting circuit 16 can be eliminated almost completely. Accordingly, the present embodiment 9 can reduce the pass phase fluctuations with maintaining the noise characteristics or efficiency.

Although the present embodiment 9 is described by way of example in which the phase adjusting circuit 16 includes the switch 85, this is not essential. For example, as shown FIG. 15, the phase adjusting circuit 16 can include a diode 91 such as a PIN diode, Schottky diode and PN diode. In this case, although the diode 91 is connected to the control terminal 82 via a bias feed resistor 92, a bias feed inductor 93 can be connected in place of the bias feed resistor 92.

Figure 15:
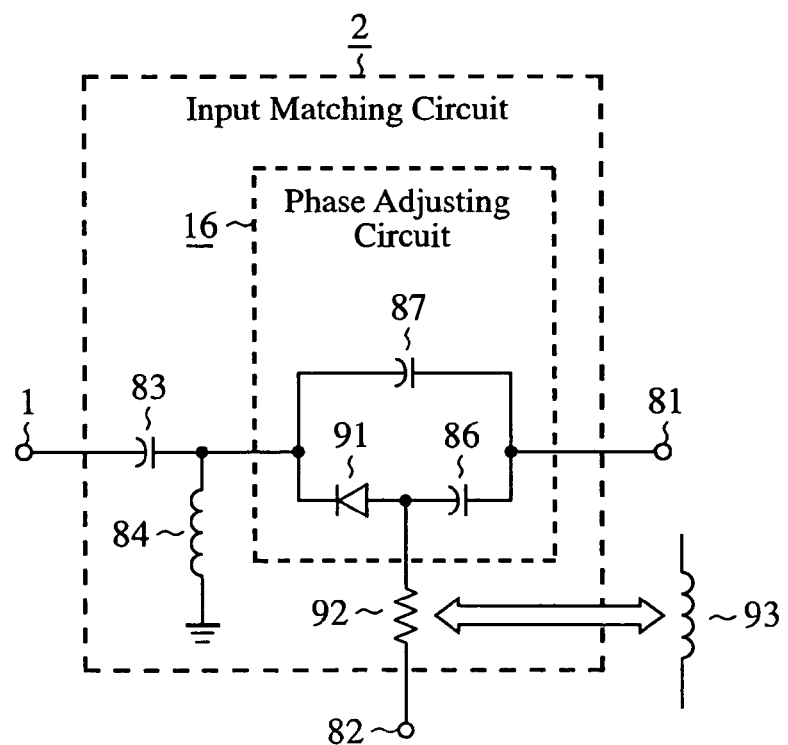
FIG. 15 is a circuit diagram showing an internal configuration of the input matching circuit.

Utilizing the PIN diode as in FIG. 15 enables a reduction in the current consumption in the on state of the diode 91, thereby being able to increase the efficiency.

In addition, when employing a Schottky diode or PN diode, the diode 91 can be implemented by using the source and drain terminals of an FET in common, or by using the emitter and collector terminals of the HBT in common.

As for the Schottky diode or PN diode, they can be formed on the same semiconductor substrate as the amplifying element used for the high-power amplifier together with the capacitors and resistors. Accordingly, they can be integrated into an MMIC, enabling the miniaturization of the high-power amplifier.

Figure 16:
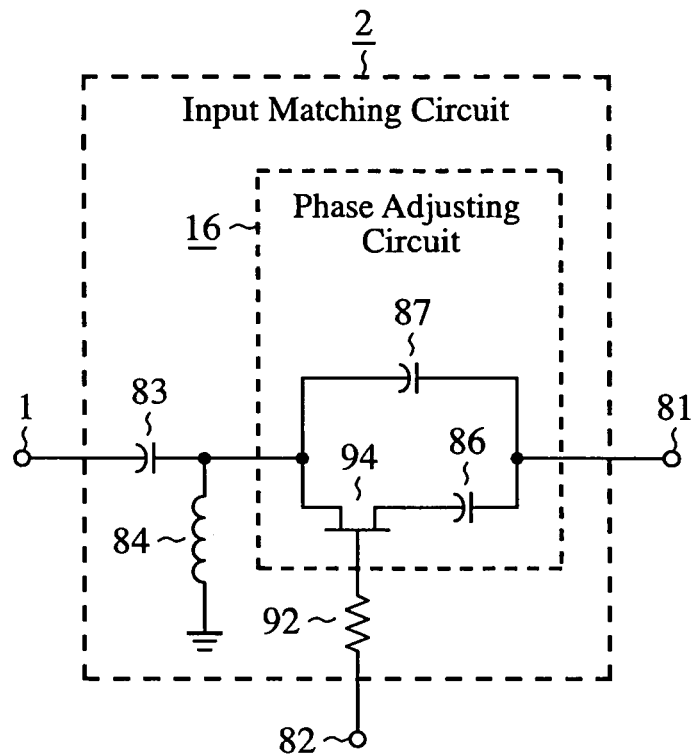
FIG. 16 is a circuit diagram showing an internal configuration of the input matching circuit.

Alternatively, as shown in FIG. 16, the phase adjusting circuit 16 can include a transistor 94 such as a BJT, HBT and FET.

When employing the transistor 94 such as the BJT, HBT and FET as shown in FIG. 16, they can be formed on the same semiconductor substrate as the amplifying element 3 used for the high-power amplifier together with the capacitors and resistors. Accordingly, they can be integrated into an MMIC, enabling the miniaturization of the high-power amplifier.

In addition, since the transistor 94 isolates the signal line from the control terminal 82, it can implement a low loss switch, which enables the reduction in the loss of the phase adjusting circuit 16, and the low noise, high efficiency characteristics.

Incidentally, a mechanical switch such as a MEMS switch can be used as the switch 85. Employing the MEMS switch makes it possible to implement the low noise, high efficiency characteristics because the MEMS switch has low loss characteristics and hence reduces the loss of the phase adjusting circuit 16.

INDUSTRIAL APPLICABILITY

As described above, the high-power amplifier in accordance with the present invention is suitable for mobile phones and the like requiring improved efficiency even when they transmit at the low output power 10-15 dB less than the maximum output power.

What is claimed is:

1. A high-power amplifier comprising:
an amplifying device for amplifying an input signal and outputting an amplified signal, said amplifying device having a single stage or multiple stage configuration;
a matching circuit connected between a final stage amplifying element and an output terminal; and
matching condition changing means for changing a matching condition of said matching circuit in order to change an imaginary part of an output load impedance of the final stage amplifying element in response to output power of the amplifying device.

2. The high-power amplifier according to claim 1, wherein said matching condition changing means changes the matching condition of said matching circuit in order to increase an imaginary part of an output load impedance of the final stage amplifying element when the output power of said amplifying device reduces.

3. The high-power amplifier according to claim 1, wherein when said matching circuit includes a plurality of impedance circuits composed of impedance components, said matching condition changing means carries out on and off control of a switch in said impedance circuits in response to the output power of said amplifying device.

4. The high-power amplifier according to claim 3, wherein when a first impedance circuit having a DC-cut capacitor and a switch connected in series and a second impedance circuit having an inductor and a capacitor connected in series are connected in parallel, said matching condition changing means turns on said switch when the output power of said amplifying device is greater than predetermined power, and turns off the switch when the output power of said amplifying device is less than the predetermined power.

5. The high-power amplifier according to claim 3, wherein when a first impedance circuit having a DC-cut capacitor and a switch connected in series and a second impedance circuit consisting of a capacitor are connected in parallel, said matching condition changing means turns off said switch when the output power of said amplifying device is greater than predetermined power, and turns on the switch when the output power of said amplifying device is less than the predetermined power.

6. The high-power amplifier according to claim 3, wherein when a bias feed circuit for supplying a bias to a collector or drain of the final stage amplifying element is connected to an input terminal of said matching circuit, a capacitor is connected in parallel with said bias feed circuit.

7. The high-power amplifier according to claim 3, wherein said switch in said impedance circuit is composed of a PIN diode.

8. The high-power amplifier according to claim 7, further comprising a bias circuit that utilizes a positive power supply voltage as a driving voltage to supply the PIN diode with one of positive polarity and negative polarity voltages in response to a control signal.

9. The high-power amplifier according to claim 3, wherein the switch in said impedance circuit consists of a transistor switch.

10. The high-power amplifier according to claim 3, wherein the switch in said impedance circuit consists of a mechanical switch.

11. The high-power amplifier according to claim 1, further comprising voltage control means for controlling a base voltage or gate voltage of said amplifying device in order to reduce an idle current of said amplifying device when the output power of said amplifying device reduces.

12. The high-power amplifier according to claim 1, further comprising voltage control means for reducing a collector voltage or drain voltage of said amplifying device when the output power of said amplifying device reduces.

13. The high-power amplifier according to claim 1, further comprising a phase adjusting circuit for adjusting a pass phase of the input signal in order to reduce fluctuations in the pass phase when the matching condition of said matching circuit is changed, said phase adjusting circuit being placed on an input side of said amplifying device or in an interstage matching circuit.

14. The high-power amplifier according to claim 13, wherein said phase adjusting circuit comprises a series circuit having a capacitor and a switch connected in series and a capacitor connected in parallel with said series circuit, wherein said switch is turned on when the output power of said amplifying device is greater than predetermined power, and is turned off when the output power of said amplifying device is less than the predetermined power.

15. A method for increasing efficiency of a high-power amplifying device at low output power, said amplifying device having a single stage or multiple stage configuration, comprising:

amplifying an input signal and outputting an amplified signal;

providing a matching circuit between a final stage amplifying element and an output terminal; and changing a matching condition of said matching circuit for increasing an imaginary part of an output load impedance of the final stage amplifying element in response to a reduction of output power of the amplifying device.

16. The method according to claim 15, wherein when said matching circuit includes a plurality of impedance circuits composed of impedance components, the method further comprising: controlling on and off operation of a switch in said impedance circuits in response to the output power of said amplifying device.

17. The method according to claim 16, further comprising:
connecting a first impedance circuit and a second impedance circuit in parallel, wherein the first impedance circuit having a DC-cut capacitor and a switch connected in series and the second impedance circuit having an inductor and a capacitor connected in series;
turning said switch on when the output power of said amplifying device is greater than predetermined power, and turning said switch off when the output power of said amplifying device is less than the predetermined power.

18. The method according to claim 16, further comprising:
connecting a first impedance circuit and a second impedance circuit in parallel, wherein the first impedance circuit having a DC-cut capacitor and a switch connected in series and the second impedance circuit consisting of a capacitor; and
turning said switch off when the output power of said amplifying device is greater than predetermined power, and turning said switch on when the output power of said amplifying device is less than the predetermined power.

19. The method according to claim 16, further comprising:
connecting a bias feed circuit for supplying a bias to a collector or drain of the final stage amplifying element to an input terminal of said matching circuit; and
connecting a capacitor in parallel with said bias feed circuit.

20. The method according to claim 15, further comprising controlling a base voltage or gate voltage of said amplifying device in order to reduce an idle current of said amplifying device when the output power of said amplifying device reduces.

21. The method according to claim 15, further comprising reducing a collector voltage or drain voltage of said amplifying device when the output power of said amplifying device reduces.

22. The method according to claim 15, further comprising providing a phase adjusting circuit on an input side of said amplifying device or in an interstage matching circuit for adjusting a pass phase of the input signal in order to reduce fluctuations in the pass phase in response to the change in the matching condition of said matching circuit.

23. The method according to claim 22, wherein said phase adjusting circuit comprises a series circuit having a capacitor and a switch connected in series and a capacitor connected in parallel with said series circuit, the method further comprising:
turning said switch on when the output power of said amplifying device is greater than predetermined power; and
turning said switch off when the output power of said amplifying device is less than the predetermined power.

24. A high-power amplifier comprising:
an amplifying device for amplifying an input signal and outputting an amplified signal, said amplifying device having a single stage or multiple stage configuration;
a matching circuit connected between a final stage amplifying element and an output terminal;
matching condition changing means for changing a matching condition of said matching circuit in response to output power of the amplifying device; and
a voltage control means for controlling a base voltage or gate voltage of said amplifying device in order to reduce an idle current of said amplifying device when the output power of said amplifying device reduces.

* * * * *